United States Patent [19]

Day

[11] 3,721,903

[45] March 20, 1973

[54] HIGH FREQUENCY MIXER AND MODULAR REPLACEABLE ELEMENT THEREFOR

[75] Inventor: William B. Day, Dunedin, Fla.

[73] Assignee: Sperry Rand Corporation, New York, N.Y.

[22] Filed: Nov. 17, 1971

[21] Appl. No.: 199,704

[52] U.S. Cl. .................................... 325/445, 325/449

[51] Int. Cl. .................................... H04b 1/26

[58] Field of Search ......325/355, 436, 442, 445, 449; 329/160–162

[56] References Cited

UNITED STATES PATENTS 2,945,122 7/1960 Lanciani ..............................325/455

*Primary Examiner*—Albert J. Mayer

*Attorney*—Howard P. Terry

[57] ABSTRACT

A high frequency diode microwave frequency converter or mixer has its active mixer diode element mounted in a wave guide slot in a replaceable module also including an output intermediate frequency transmission line. The module is clamped into position in a module holder having a passage coupling to the module wave guide slot and at the same time furnishing walls for a high frequency rejection resonant cavity slot cooperating with the intermediate frequency transmission line.

7 Claims, 5 Drawing Figures

HIGH FREQUENCY MIXER AND MODULAR REPLACEABLE ELEMENT THEREFOR

BACKGROUND OF THE INVENTION

1. Field of the Invention

The invention pertains to compact high frequency signal converters or mixers for generating intermediate frequency signals and more particularly pertains to transmission line mixer devices of modular character readily replaceable with respect to cooperating module holder elements.

2. Description of the Prior Art

The sensitivity or effective conversion loss, sometimes called the transducer loss, and the instantaneous band width are important characteristics of high frequency or microwave transmission line signal converters or mixer devices. Particularly, in the design of millimeter carrier wave length mixer devices, these two characteristics are of major significance for optimization. Since the parameters of the best available mixer diodes are relatively fixed, being established by the limits imposed by the state of the semiconductor technology, the microwave engineer has mainly the option of attempting to perfect the design of the mixer circuit itself and of its internal elements for mounting available mixer diodes; i.e., the circuits which connect the mixer diode to the carrier frequency and intermediate frequency port.

A desirable high frequency or millimeter converter or mixer device should meet several criteria. The material used for its construction must present very low resistivity wherever its surfaces are to accommodate flow of high or intermediate frequency currents. Furthermore, the carrier frequency and local oscillator energy must be efficiently coupled to the mixer diode. High frequency energy must not escape into the intermediate frequency portion of the mixer circuit, must not be reflected out of the carrier input port, and must not be uselessly dissipated in unnecessary or complex circuit configurations.

Impedance matching structures are normally required in the mixer, and they should be as close as possible to the mixer diode. For example, the maximum distance between the mixer diode and matching elements such as transmission line short circuiting devices must be less than half of the guide wave length. For a very high carrier frequency such as 60 GHz, for example, such a distance will be substantially 0.132 inches from the mixer diode active junction.

It has been shown that the intermediate frequency capacitance C of the mixer diode mounting structure as viewed from the intermediate frequency port must have a low value if the mixer is to operate over a broad band of frequencies:

$$BW \propto 1/RC$$

The value of the shunt resistance R being substantially fixed by the design of the mixer diode itself, only the parameter C is left for adjustment.

Various practical applications made in the recent prior art have already dictated that millimeter or other high frequency mixer devices be mounted in readily replaceable modules or packages. At such carrier wave lengths, the mixer diodes and other circuit elements are necessarily very small and consequently fragile and are relatively easily damaged by improper handling or by the application of spurious electrical voltages. Accordingly, the probability of replacement is relatively high. Such replaceable packages also permit the establishment before use of the individual characteristics of individual mixer packages; thus, the performance of balanced mixers can usually be improved by the selection of matched pairs of such packages.

Prior art approaches to improved carrier converter or mixer devices have generally been along one of two avenues. In one arrangement, the replaceable holder package is formed from a parallel-sided metal strip or slab with the mixer diode being placed in a small rectangular wave guide slot cut through the relatively thin dimension of the strip. The strip package is then clamped between two sections of similarly dimensioned wave guide so that the rectangular slot becomes an intermediate section of a smooth rectangular wave guide. The intermediate frequency signal is extracted through a filter formed by a short section of low impedance coaxial transmission line filled with a bonding resin. While representing an improvement over earlier prior art devices, intermediate frequency capacitances of the order of 3 to 4 picofarads were usually achieved, severely restricting the band width of the mixer.

Another type of output filter configuration which has been employed uses a radial choke in the outer conductor of the coaxial line filter. This arrangement provides a desirable very high rejection at the operating high frequency without significantly increasing the shunt capacitance C across the coaxial line. While the filter meets many of the needs discussed in the foregoing, the size of the radial cavity is so great that the arrangement cannot be incorporated within a removable mixer package without interfering with the placement of the desired impedance matching configuration.

SUMMARY OF THE INVENTION

The present invention relates to a very high frequency diode signal converter or mixer having its active semiconductor diode element mounted in a wave guide slot in a metal strip formed in the shape of a replaceable module. The strip also includes a branching coaxial transmission system for extraction of intermediate frequency energy. The strip module is fixedly clamped within a passage in a module holder providing high frequency energy coupling to the wave guide slot and furthermore defining, in cooperation with the modular strip, walls for a high frequency signal rejection resonant cavity in circuit with the intermediate frequency output transmission line.

DESCRIPTION OF THE PREFERRED EMBODIMENTS

Figure 1:
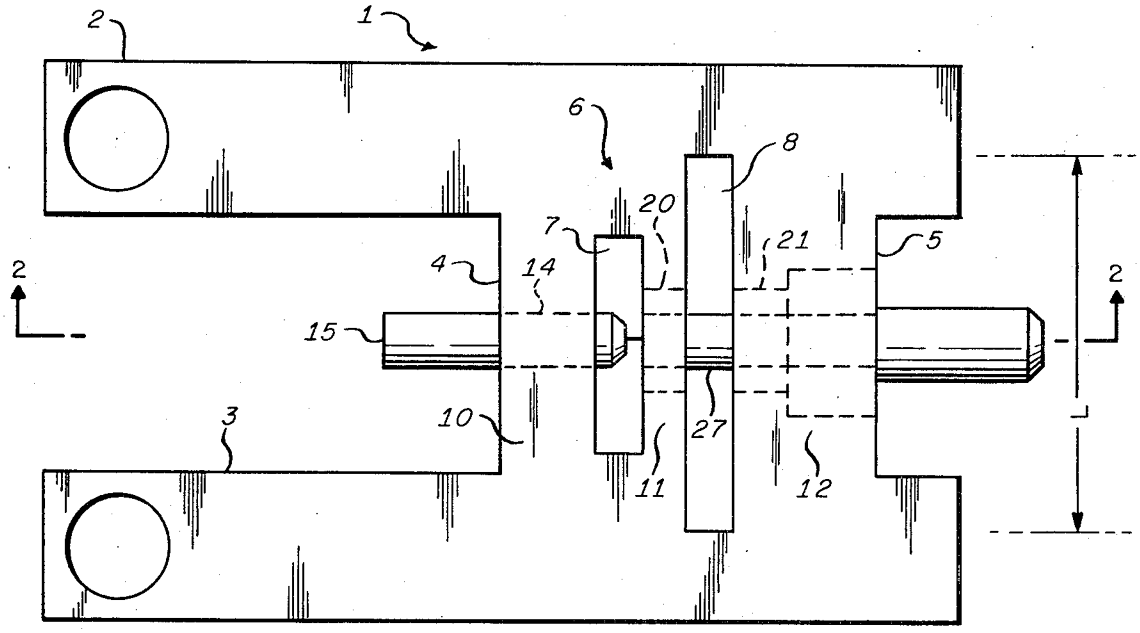
FIG. 1 is a plan view of the signal converter or mixer module according to the present invention.
Figures 2, 3:
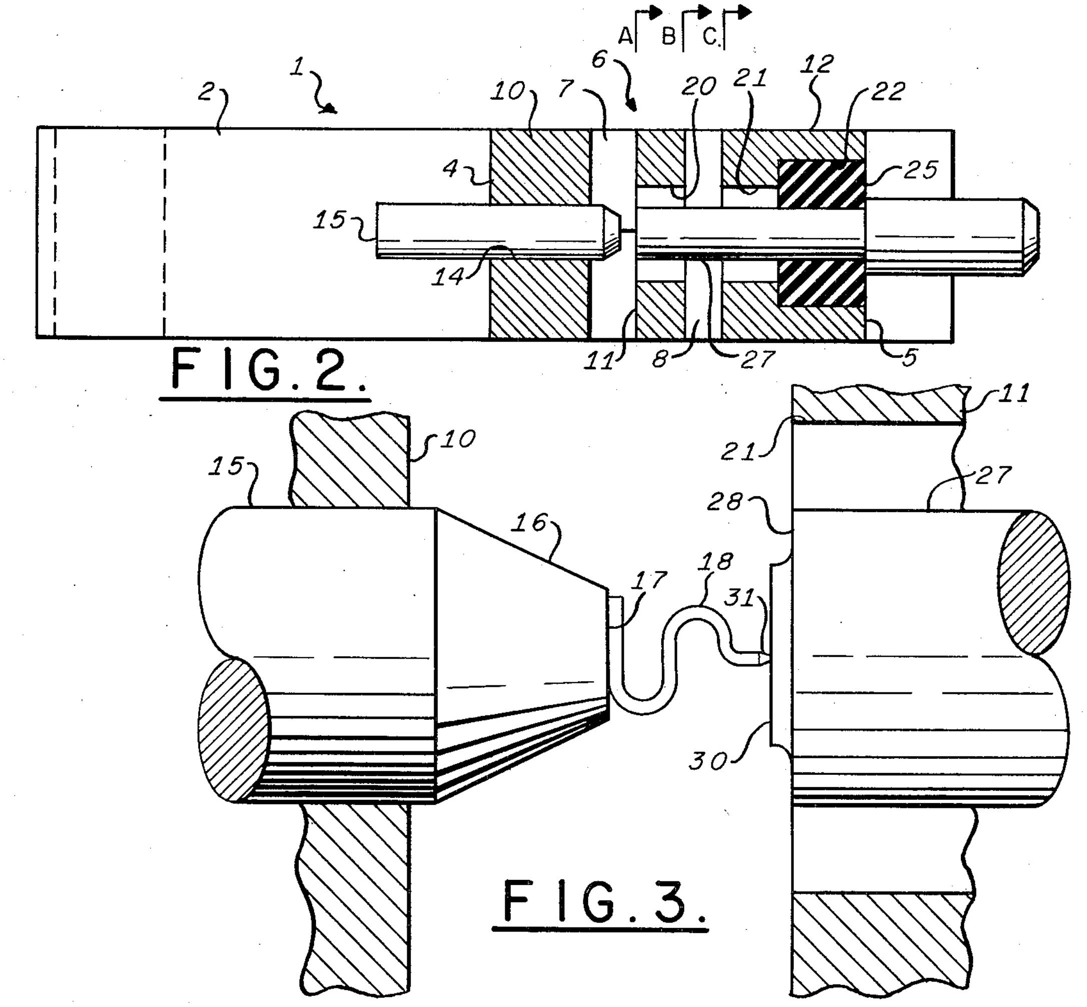
FIG. 2 is a side view, partly in cross section, taken along the line 2—2 of FIG. 1.
FIG. 3 is an enlarged view of a portion of FIG. 2 also partly in cross section.

Referring to FIGS. 1 and 2, the body of the replaceable or modular package portion of the novel high frequency signal converter mixer is seen to be formed of a cut-away strip or slab 1 of metal having a distorted H shape with legs 2 and 3 and recessed faces 4 and 5 forming parallel boundaries of the bar 6 of the H. First and second slots 7 and 8 are milled or otherwise formed in the bar 6 substantially at right angles to legs 2 and 3. Slot 7 may be formed largely within the bar 6, while slot 8 may extend beyond bar 6 into the volume of legs 2 and 3. Thus, bar 6 is generally divided into a trio of cooperating bridging elements 10, 11, and 12. The strip 1 may be composed of copper or of another such metal having low surface resistivity to the flow of high frequency currents. In particular, the walls of slots 7 and 8 must present such a property.

The bridging element 4 is provided with a centrally located hole 14 for fixedly supporting a round rod 15 presenting high frequency current conducting surfaces. As is seen in greater detail in FIGS. 2 and 3, the rod 15 is provided, for example, with a tip 16 in the form of a frustrum of a cone with a flat outer face 17. A Schottky barrier junction diode spring contact element 18 of conventional design is affixed to face 17, although conventional point diodes may alternatively be used.

Referring to FIGS. 1, 2, and 3, bridging element 11 is provided with a central bore 20 of somewhat larger diameter than rod 15. Bore 20 is aligned with and would normally be made at the same time as the central bore 21 in bridging element 12. Bridging element 12 is supplied with a second bore 22 having an axis common with the axis of bores 20 and 21 and having a slightly increased diameter for supporting a dielectric bead 25. Bores 20, 21, and 22 have at least surfaces presenting low resistivity to intermediate frequency currents.

The bridging element 12 and the low loss dielectric bead 25 form a support for a round rod 27 presenting low resistivity to the flow on its surfaces of intermediate frequency currents. Rod 27 extends through bead 25 and centrally through bore 21, slot 8, and bore 20, ending at face 28 located at substantially the surface of slot 7 opposite rod 15. At face 28, rod 27 supports a semiconductor diode wafer 30 contacted by the point 31 of diode spring point contact element 18 in a conventional manner. It is to be recognized that alternative forms of the spring point contact element 18, as well as other types of semiconductor rectifying junctions, may be employed in lieu of the arrangement of FIG. 3.

Figures 4, 5:
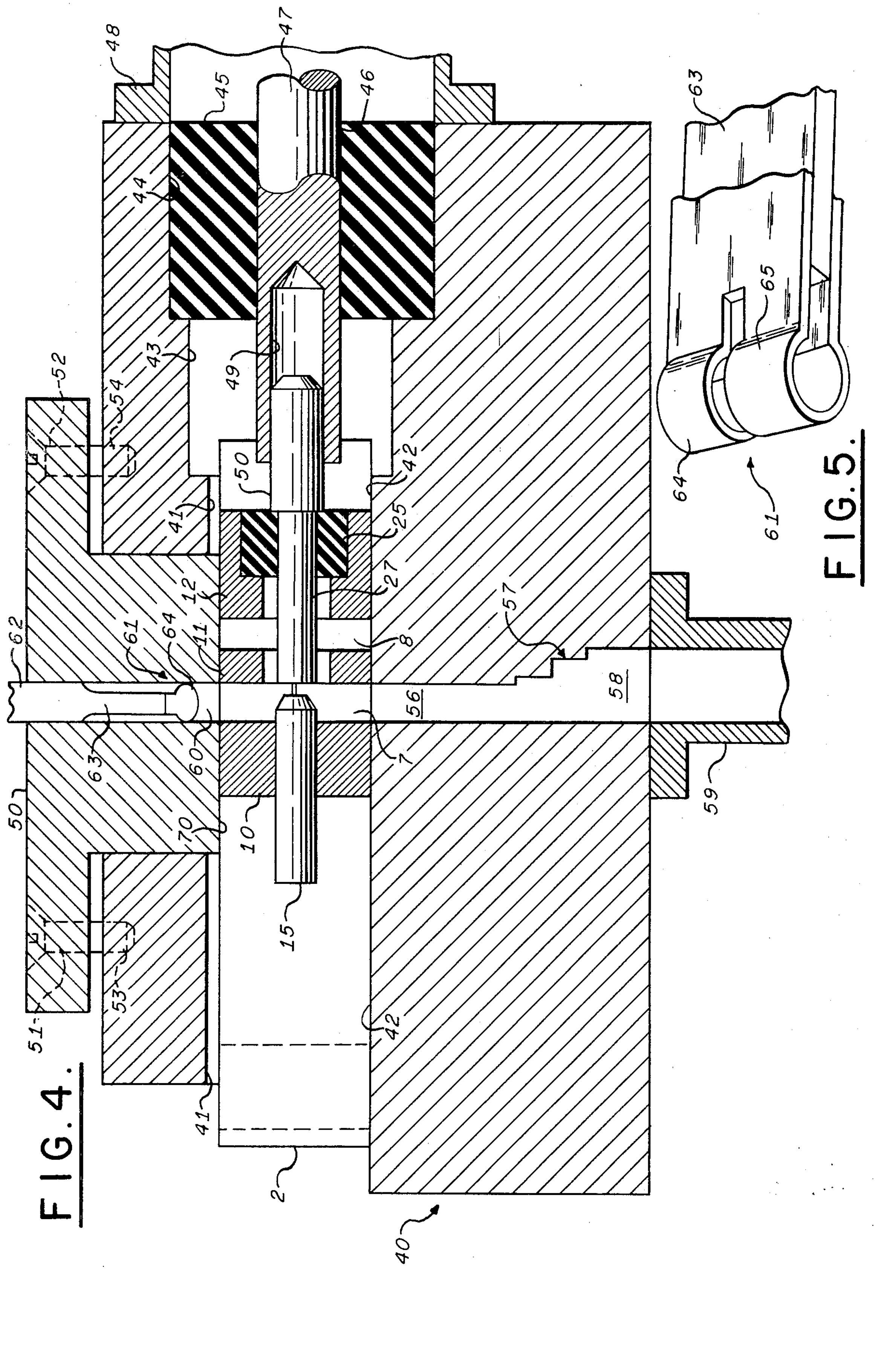
FIG. 4 is a plan view of the mixer module as viewed in FIG. 2 and placed in a cross sectional view of the novel module holder.
FIG. 5 is a perspective view of a part of the apparatus of FIG. 4.

In its use as a replaceable element, the modular or packaged signal converter or mixer device of FIGS. 1 and 2 is clamped in position within a metal body or module holder 40 performing additional functions of the signal converter or mixer device, as in FIG. 4. The body 40 comprises a generally cubical metal body through which certain passages have been formed, such as a first rectangular cross section passage with walls such as walls 41 and 42 permitting the strip or slab 2 readily to be inserted in the passage. The passage within body or holder 40 extends past the right hand end of slab 2 in the form of a circular bore 43, being further extended by a second circular bore 44 accommodating a low loss dielectric bead 45. Bead 45, in turn, has a central bore 46 for supporting a central conductor 47 of a coaxial transmission line whose outer conductor 48 may be fastened by conventional means to a face of body or module holder 40 in concentric relation with conductor 46. Outer conductor 48 may be adjusted to form an impedance matched continuation of the conducting surface of bore 44. In a similar manner, the inner conductor 47 is arranged with a bore 49 so that it may be conductively coupled over rod 50 as a matched extension of the conducting rod 27. Accordingly, it is seen that the coaxial intermediate frequency conducting surfaces 21, 27 are respectively coupled in impedance matched relation to an output intermediate frequency coaxial transmission line comprising conductors 47 and 48 used in the normal fashion to supply intermediate frequency signals to utilization apparatus and also to supply a unidirectional current bias in the conventional manner to rectifier 30, 31.

As seen in FIG. 4, the strip or slab 2 is firmly held in position within the passage between walls 41, 42 by a clamp device 50 held in place by fasteners such as screws 51, 52 passing through associated clearance holes in clamp 50 and threaded into body 40 at locations 53, 54.

Body or module holder 40 is equipped with a second passage 56 in the form of a wave guide transmission line, the strip 2 being adjusted so that the slot or wave guide 7 within strip 2 smoothly matches wave guide 56. Guide 56 may be supplied with a binomially stepped or wave guide impedance matching section 57 for coupling guide 56 to a larger guide 58 of a size suitable for coupling, in turn, in a standard manner to an external rectangular wave guide 59 for supply of high frequency carrier and local oscillator signals to the mixer system.

Clamp 50 is supplied with a passage 60 in the form of a wave guide normally positioned so that it smoothly joins the slot 7 of strip 2 and therefore representing a smooth extension of wave guides 7 and 56. The function of wave guide extension 60 is to accommodate an adjustable short circuit 61, seen in greater detail in FIG. 5. Short circuiting device 61 my be a conventional device, comprising a handle section 62 to which is attached a narrow section 63 supporting one or more spring loops 64. 65. Loops 64, 65 may be made slightly larger in diameter than the height of wave guide 60, so that the spring-like nature of the loops 64, 65 urges them securely against the broad conductive walls of wave guide 60. It is seen that a rectangular wave guide resonant cavity is formed when the strip 2 is properly placed within body or holder 40 and clamp 50 is fixed in place. Slot 8, having its open sides thus closed at one side by wall 42 of body 40 and on the other side by the inner wall 70 of clamp 50, is converted into a resonant cavity in the form of a six-sided rectangular parallelopiped, with the intermediate frequency conductor 27 passing through it centrally. The cavity thus formed in cooperation with walls or closure means 42, 70 is resonant when its length L (as viewed in FIG. 2) is made one half of the cavity guide wave length (slightly modified by the perturbation due to the presence of conductor 27). By properly determining the length L of slot 8, this resonant or signal rejection frequency is readily made to coincide substantially with the center of the desired carrier frequency pass band of the mixer device, and any high frequency energy as tends to enter the intermediate frequency output is substantially entirely reflected into the high frequency portion of the converter or mixer device. Further, the intermediate frequency shunt capacity C is desirably reduced from 3 to 4 picofarads to less than 0.5 picofarads, providing an improvement as large as ten to one in the theoretical band width of the mixer device.

Operation of the invention is fully apparent from the foregoing discussion. Assume that the intermediate frequency port 47, 48 is connected to a suitably matched utilization network so that all of the intermediate frequency energy traveling toward it is absorbed, this being a realistic assumption. The carrier and local oscillator signals are introduced via the wave guide input 58 through the stepped wave guide section 57, used to achieve a characteristic impedance which matches that of the mixer diode 30, 31 at the center operating frequency. Wave guide 56 is terminated by the mixer diode 30, 31, followed by the adjustable short circuit 64, which is arranged to short circuit wave guide section 60 at a position which may be manually selected for best operation of diode 30, 31.

Both carrier and intermediate frequency energy will tend to propagate into the branching coaxial transmission line 20, 27, but the coaxial line associated with inner conductor 27 consists of several sections of coaxial transmission elements and the resonant cavity formed by slot 8 and the walls 42, 70. Since the characteristic impedances of the several sections of coaxial line formed around inner conductor 27 are substantially equal except for minor perturbations, the latter may be represented by very small capacitances and may therefore be ignored at the intermediate frequency, so that the coaxial transmission line looking from plane C of FIG. 2 may be treated as comprising a constant impedance transmission line terminated in its matching characteristic impedance.

At plane B in FIG. 2, the carrier frequency impedance is that injected by the resonant cavity of slot 8 in series with the characteristic impedance of the coaxial line of which rod 27 is the center conductor. Since the impedance of the cavity slot 8 at resonance is very high, the impedance seen looking from plane B is virtually an open circuit, and substantially all high frequency energy is reflected into the high frequency circuit.

The distance between planes A and B having been made one quarter wave length at the operating high frequency, the open circuit is transformed at plane A into an effective short circuit at the junction of the coaxial transmission line with rectangular wave guide slot 8. In other words, the inner conductor 27, at the carrier frequency, appears to be directly connected to outer conductor 20 at the rectangular wave guide surface in the plane A, and no carrier voltage appears between conductors 20 and 27. Consequently, no high frequency or carrier signal energy is lost by propagation into the intermediate frequency output port 47, 48. At the intermediate frequency, the resonant slot 8 behaves merely as a small perturbation in an otherwise substantially smooth coaxial transmission line, having no material adverse effect on the performance of the invention.

It is seen from the foregoing description that the novel signal converter or mixer device of the present invention meets the several requirements established for desirable high frequency signal converter or mixer devices. Having a construction in which high and intermediate frequency currents flow on high conductivity surfaces, the invention also couples the carrier and local oscillator energy efficiently to the mixer diode and does not permit escape of high frequency energy into the intermediate frequency portion of the device. Efficient impedance matching is provided without formation of a cumbersome package, and band width is maximized.

Furthermore, the construction lends itself to manufacture of the diode mounting portion of the apparatus on a thin (0.125 inches thick) replaceable strip or slab, making it possible to locate the adjustable short circuit within 0.06 inches of the diode junction for a 60 GHz device, for example. Above all, the novel construction is particularly a advantageous in converter or mixer devices designed to operate at very high or millimeter wave lengths, where the compact nature and small dimensions of circuit elements make conventional mixer designs difficult or even impractical of execution. The merit of the achievement is further appreciated by the observation that the scale of the drawings of FIGS. 1 and 2 is roughly ten to one, the guide 7 height being actually about 0.025 inches. It will be understood, however, that the drawings have been somewhat distorted, more clearly to illustrate certain parts of the invention, and that the dimensions implied in the drawings are not necessarily those which would be used in practice.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. High frequency signal converter means comprising:

replaceable modular means having first and second substantially parallel major planar sides;

said modular means having first and second leg means connected by first, second, and third spaced bridging means, said first and second spaced bridging means defining therebetween substantially rectangular wave guide slot means adapted to be coupled to external rectangular wave guide transmission line means, said second and third spaced bridging means defining therebetween substantially rectangular slot means adapted for cooperation with external closure means for forming high frequency resonant cavity means, intermediate frequency conductor means extending in insulated relation through said second and third bridging means and through said resonant cavity means, said conductor means having an end at said wave guide means, and high frequency diode means coupled at said conductor end to said wave guide slot means.

2. Apparatus as described in claim 1 comprising:

electrically insulating support means for supporting said conductor means within said third bridging means, said second and third bridging means forming spaced coaxial transmission line means in cooperation with said conductor means.

3. Apparatus as described in claim 1 wherein said diode means comprises:

semiconductor means conductively supported at said conductor end, and spring point contact means conductively supported by said wave guide slot means in contacting relation with said semiconductor means.

4. APparatus as described in claim 1 wherein said closure means comprises:

module holder means having a passage with first and second opposed walls for encompassing said replaceable modular means, said module holder means having high frequency transmission line means adapted to be coupled in impedance matched relation to said wave guide slot means at said first planar side of said modular means.

5. Apparatus as described in claim 4 wherein said closure means additionally comprises high frequency transmission line short circuiting means adapted to be coupled in impedance matched relation with said wave guide slot means at said second planar side of said modular means.

6. Apparatus as described in claim 5 wherein said first and second opposed walls of said passage are adapted to form closure walls of said cavity resonator slot at said respective first and second planar sides of said modular means.

7. Apparatus as described in claim 4 additionally comprising coaxial transmission line means adapted to be connected in conductive relation to said intermediate frequency conductor means for conduction of said intermediate frequency signals to utilization means external of said module holder means.

* * * * *